United States Patent
Fujiwara et al.

(10) Patent No.: US 9,722,576 B2
(45) Date of Patent: *Aug. 1, 2017

(54) ELASTIC WAVE FILTER AND DUPLEXER USING SAME

(71) Applicant: SKYWORKS FILTER SOLUTIONS JAPAN CO., LTD., Kadoma-Shi (JP)

(72) Inventors: Joji Fujiwara, Osaka-Fu (JP); Tetsuya Tsurunari, Osaka-Fu (JP); Hiroyuki Nakamura, Osaka-Fu (JP); Rei Goto, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/943,683

(22) Filed: Nov. 17, 2015

(65) Prior Publication Data

US 2016/0072471 A1   Mar. 10, 2016

Related U.S. Application Data

(62) Division of application No. 13/845,547, filed on Mar. 18, 2013, now Pat. No. 9,203,378, which is a division
(Continued)

(30) Foreign Application Priority Data

Mar. 14, 2008  (JP) .................................. 2008-065388
Apr. 24, 2008  (JP) .................................. 2008-113563

(51) Int. Cl.
*H03H 9/72*  (2006.01)
*H03H 9/64*  (2006.01)
(Continued)

(52) U.S. Cl.
CPC .......... *H03H 9/725* (2013.01); *H03H 9/0023* (2013.01); *H03H 9/0071* (2013.01);
(Continued)

(58) Field of Classification Search
CPC .. H03H 9/0023; H03H 9/0028; H03H 9/0033; H03H 9/0038; H03H 9/0071;
(Continued)

(56) References Cited

U.S. PATENT DOCUMENTS 6,816,036 B2   11/2004   Takamine
7,154,359 B2   12/2006   Inoue et al.
(Continued)

FOREIGN PATENT DOCUMENTS

JP   2001313540 A   11/2001
JP   2002314371 A   10/2002
(Continued)

OTHER PUBLICATIONS

A.S. Loseu et al., "Improvement of Balance Performance in LSAW Filters Based on 5-IDT Multi-Mode Structure", 2007 IEEE Ultrasonics Symposium, Oct. 28-31, 2007, pp. 2363-2366.
(Continued)

*Primary Examiner* — Barbara Summons
(74) *Attorney, Agent, or Firm* — Lando & Anastasi, LLP

(57) ABSTRACT

An elastic wave filter has an unbalanced signal terminal, first and second balanced signal terminals, and first through fifth IDT electrodes arranged in ordinal order between a pair of grating reflectors. Wiring electrodes of the third and fifth IDT electrodes are disposed adjacent a ground electrode of the fourth IDT electrode, wiring electrodes of the second and third IDT electrodes are disposed adjacent one another, and ground electrodes of the first and second IDT electrodes are disposed adjacent one another. The unbalanced signal terminal is connected to the wiring electrodes of the first, third,
(Continued)

and fifth IDT electrodes, and the first and second balanced signal terminals are connected to the wiring electrodes of the second and fourth IDT electrodes, respectively. A pitch gradation of pitch spacing between electrode fingers in each of the first, second, and third IDT electrodes on one side of a center line in the third IDT electrode is gradually reduced by a first spacing $\alpha$, and a pitch gradation of pitch spacing between electrode fingers in each of the third, fourth, and fifth IDT electrodes on the other side of the center line is gradually reduced by a second spacing $\beta$ ($\beta \neq \alpha$), as the distance from the center line increases.

19 Claims, 13 Drawing Sheets

Related U.S. Application Data of application No. 12/921,580, filed as application No. PCT/JP2009/000972 on Mar. 4, 2009, now Pat. No. 8,427,259.

(51) Int. Cl.
*H03H 9/70* (2006.01)
*H03H 9/00* (2006.01)

(52) U.S. Cl.
CPC ........ *H03H 9/6436* (2013.01); *H03H 9/6476* (2013.01); *H03H 9/70* (2013.01); *H03H 9/0038* (2013.01)

(58) Field of Classification Search
CPC .... H03H 9/6436; H03H 9/644; H03H 9/6456; H03H 9/6476; H03H 9/70; H03H 9/725
USPC .......... 333/133, 193, 195; 310/313 B, 313 D
See application file for complete search history.

(56) References Cited

U.S. PATENT DOCUMENTS

| | | | |
|---|---|---|---|
| 7,501,912 B2 | 3/2009 | Jamneala et al. | |
| 7,532,090 B2 | 5/2009 | Takamine | |
| 8,427,259 B2* | 4/2013 | Fujiwara | H03H 9/0071 |
| | | | 310/313 B |
| 8,482,363 B2 | 7/2013 | Fujiwara et al. | |
| 9,203,378 B2* | 12/2015 | Fujiwara | H03H 9/0071 |
| 2002/0163403 A1 | 11/2002 | Sawada et al. | |
| 2003/0107454 A1 | 6/2003 | Nakamura et al. | |
| 2003/0137365 A1 | 7/2003 | Takamine | |
| 2003/0146805 A1 | 8/2003 | Sawada | |
| 2003/0164745 A1 | 9/2003 | Takamine | |
| 2004/0124740 A1 | 7/2004 | Takamine et al. | |
| 2007/0040633 A1 | 2/2007 | Yoshimoto | |
| 2007/0075804 A1 | 4/2007 | Otsuka | |
| 2007/0290770 A1 | 12/2007 | Otsuka et al. | |
| 2008/0024246 A1 | 1/2008 | Kaneda et al. | |
| 2009/0002097 A1 | 1/2009 | Takamine | |

FOREIGN PATENT DOCUMENTS

| | | |
|---|---|---|
| JP | 2005223809 A | 8/2005 |
| JP | 2008/035092 A | 2/2008 |
| JP | 2008035007 A | 2/2008 |
| WO | 2007116760 A1 | 10/2007 |

OTHER PUBLICATIONS

International Search Report issued May 26, 2009 in International (PCT) Application No. PCT/JP2009/000972.

J. Meltaus et al., "Low-Loss, Multimode 5-IDT SAW Filter", IEEE Transactions on Ultrasonics, Ferroelectrics, and Frequency Control, vol. 52, No. 6, Jun. 2005, pp. 1013-1019.

\* cited by examiner

FIG. 14 - PRIOR ART
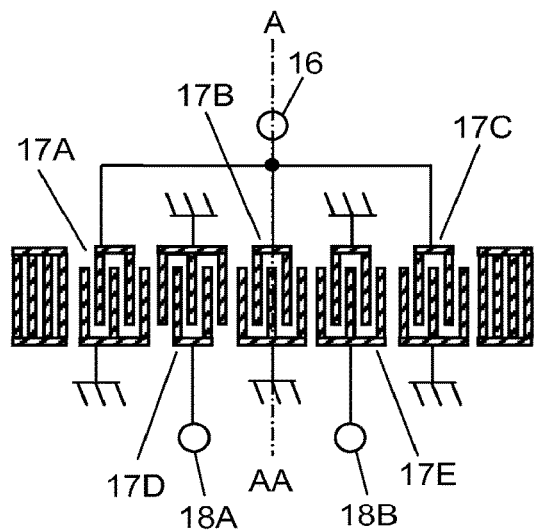
FIG. 15 - PRIOR ART
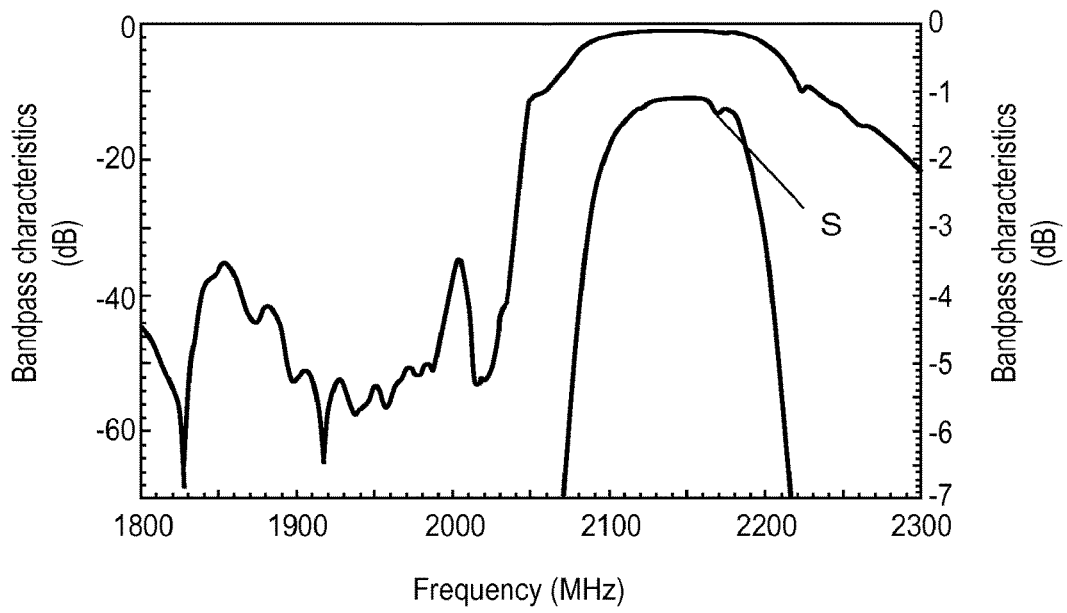

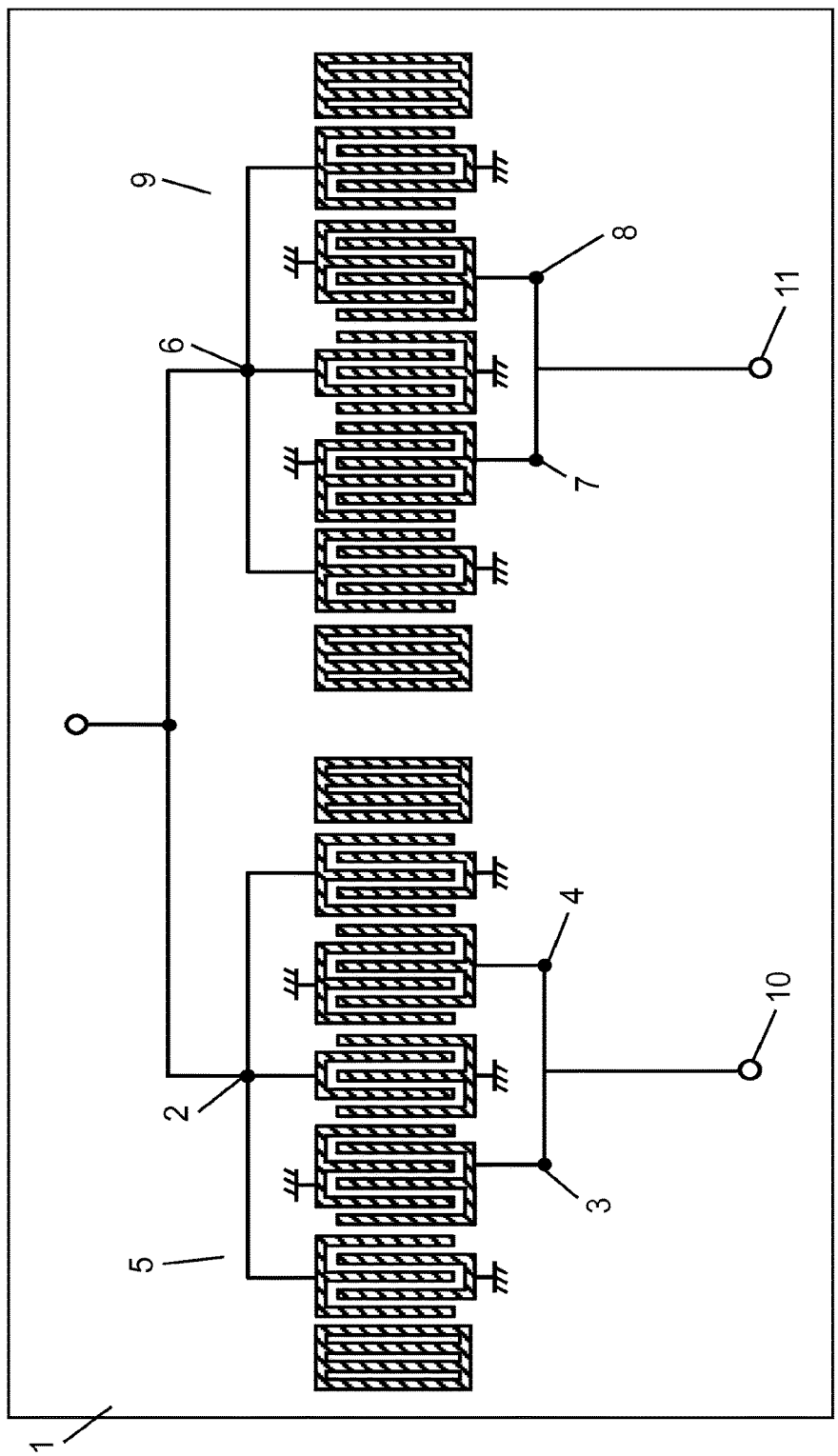
FIG. 16 - PRIOR ART

FIG. 17 - PRIOR ART
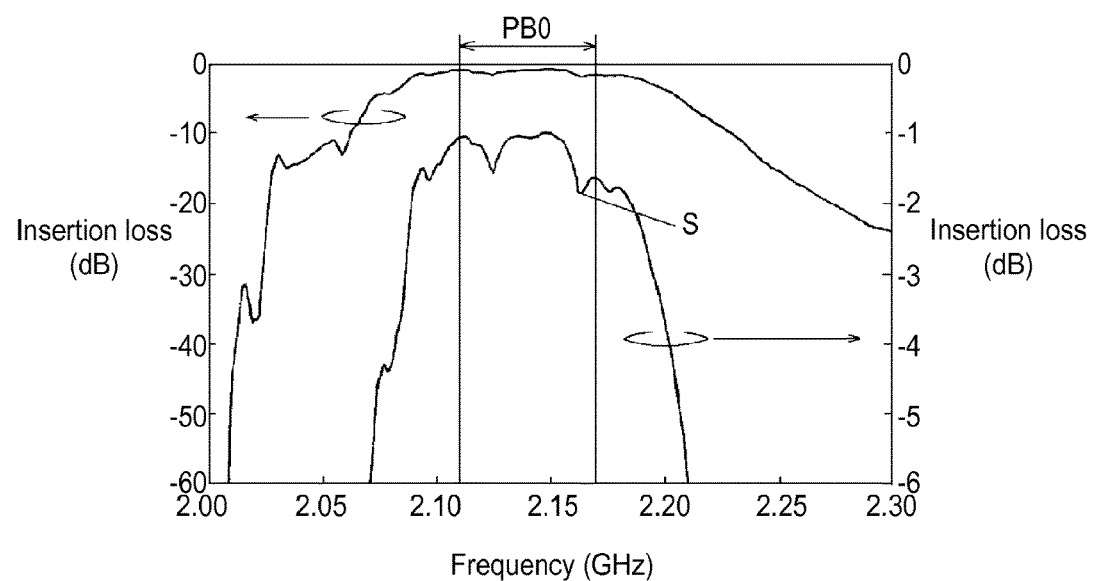

ELASTIC WAVE FILTER AND DUPLEXER USING SAME

CROSS-REFERENCE TO RELATED APPLICATIONS

This application is a division of and claims priority under 35 U.S.C. §§120 and 121 to U.S. patent application Ser. No. 13/845,547, now U.S. Pat. No. 9,203,378, titled "ELASTIC WAVE FILTER, AND DUPLEXER AND ELECTRONIC DEVICE USING SAME" and filed on Mar. 18, 2013, which is herein incorporated by reference, and which is a division of and claims priority under 35 U.S.C. §§120 and 121 to U.S. patent application Ser. No. 12/921,580 filed on Sep. 9, 2010 and now U.S. Pat. No. 8,427,259, which is a §371 application of International Application No. PCT/JP2009/000972 filed on Mar. 4, 2009 and which claims the benefit of Japanese Application Nos. 2008-113563 and 2008-065388.

TECHNICAL FIELD

The present invention relates to an elastic wave filter for use in a portable phone, for example, and to a duplexer and an electronic device using the elastic wave filter.

BACKGROUND ART

As shown in the configuration diagram of FIG. 14, a conventional elastic wave filter of this type has unbalanced signal terminal 16; and first, second, and third interdigital transducer (IDT) electrodes 17A, 17B, and 17C whose wiring electrodes are electrically connected to unbalanced signal terminal 16. The conventional elastic wave filter also has fourth IDT electrode 17D disposed between first and second IDT electrodes 17A and 17B, and fifth IDT electrode 17E disposed between second and third IDT electrodes 17B and 17C. The conventional elastic wave filter also has first balanced signal terminal 18A electrically connected to the wiring electrode of fourth IDT electrode 17D, and second balanced signal terminal 18B electrically connected to the wiring electrode of fifth IDT electrode 17E. In the conventional elastic wave filter, the ground electrodes of first, second, third, fourth, and fifth IDT electrodes 17A, 17B, 17C, 17D, and 17E are electrically connected to the ground. In the conventional elastic wave filter, a signal in opposite phase with the signal input from unbalanced signal terminal 16 is output from first balanced signal terminal 18A, and a signal in phase with the signal input from unbalanced signal terminal 16 is output from second balanced signal terminal 18B. In the conventional elastic wave filter, the ground electrodes of second and third IDT electrodes 17B and 17C are adjacent to the wiring electrode of fifth IDT electrode 17E, and the ground electrodes of first and second IDT electrodes 17A and 17B are adjacent to the ground electrode of fourth IDT electrode 17D (see Patent Literature 1, for example).

However, in such a conventional elastic wave filter, spuriousness occurs in the bandpass.

That is, in the above conventional configuration, the ground electrodes of first and second IDT electrodes 17A and 17B are adjacent to the ground electrode of fourth IDT electrode 17D, and thus spuriousness "S" occurs in the bandpass, as shown in the bandpass characteristics of FIG. 15.

Further, an elastic wave filter where the bandpass characteristics are improved by parallel-connecting the elastic wave filters of FIG. 14 is known. As shown in FIG. 16, this conventional parallel-connected elastic wave filter has first longitudinally coupled resonator elastic wave filter 5 and second longitudinally coupled resonator elastic wave filter 9 formed on piezoelectric substrate 1. The first longitudinally coupled resonator elastic wave filter has first unbalanced signal terminal 2, and first balanced signal terminal 3 and second balanced signal terminal 4 electrically connected to first unbalanced signal terminal 2. The second longitudinally coupled resonator elastic wave filter has second unbalanced signal terminal 6, and third balanced signal terminal 7 and fourth balanced signal terminal 8 electrically connected to second unbalanced signal terminal 6.

First unbalanced signal terminal 2 and second unbalanced signal terminal 6 are electrically connected to each other. First balanced signal terminal 3 and second balanced signal terminal 4 are electrically connected to first input/output terminal 10. Third balanced signal terminal 7 and fourth balanced signal terminal 8 are electrically connected to second input/output terminal 11. The input/output signal from first input/output terminal 10 is 180° out of phase with the input/output signal from second input/output signal 11 (see Patent Literature 2, for example).

However, in such a conventional parallel-connected elastic wave filter, the insertion loss degradation is large in the high-frequency part of the band.

FIG. 17 is a chart showing bandpass characteristics of a conventional parallel-connected elastic wave filter. That is, in the conventional parallel-connected elastic wave filter, as shown in FIG. 17, spuriousness "S" occurs in the high-frequency part of desired bandpass PB0. As a result, the insertion loss degradation is increased.

[Patent Literature 1]
Japanese Patent Unexamined Publication No. 2001-313540

[Patent Literature 2]
Japanese Patent Unexamined Publication No. 2002-314371

SUMMARY OF THE INVENTION

The present invention is directed to provide an elastic wave filter capable of suppressing the occurrence of spuriousness and reducing the insertion loss degradation, and a duplexer and an electronic device using the elastic wave filter.

The present invention has the following elements: an unbalanced signal terminal; first, second, and third (interdigital transducer) IDT electrodes whose wiring electrodes are electrically connected to the unbalanced signal terminal; a fourth IDT electrode disposed between the first and second IDT electrodes; a fifth IDT electrode disposed between the second and third IDT electrodes; a first balanced signal terminal electrically connected to the wiring electrode of the fourth IDT electrode; and a second balanced signal terminal electrically connected to the wiring electrode of the fifth IDT electrode. The respective ground electrodes of the first, second, third, fourth, and fifth IDT electrodes are electrically connected to the ground. A signal in opposite phase with a signal input from the unbalanced signal terminal is output from the first balanced signal terminal. A signal in phase with the signal input from the unbalanced signal terminal is output from the second balanced signal terminal. The respective wiring electrodes of the second and third IDT electrodes are adjacent to the ground electrode of the fifth IDT electrode. The wiring electrode of one of the first and second IDT electrodes is adjacent to the wiring electrode of the fourth IDT electrode. The ground electrode of the other of the first and second IDT electrodes is adjacent to the ground electrode of the fourth IDT electrode.

This configuration can suppress spuriousness in the bandpass.

BRIEF DESCRIPTION OF DRAWINGS

FIG. 14 is a configuration diagram of a conventional elastic wave filter;

FIG. 15 is a chart showing bandpass characteristics of the conventional elastic wave filter;

FIG. 16 is a configuration diagram of a conventional parallel-connected elastic wave filter; and FIG. 17 is a chart showing bandpass characteristics of the conventional parallel-connected elastic wave filter.

DETAILED DESCRIPTION OF PREFERRED EMBODIMENTS

Hereinafter, the present invention is described in accordance with exemplary embodiments with reference to the accompanying drawings. The present invention is not limited by the following exemplary embodiments.

First Exemplary Embodiment

Figure 1:
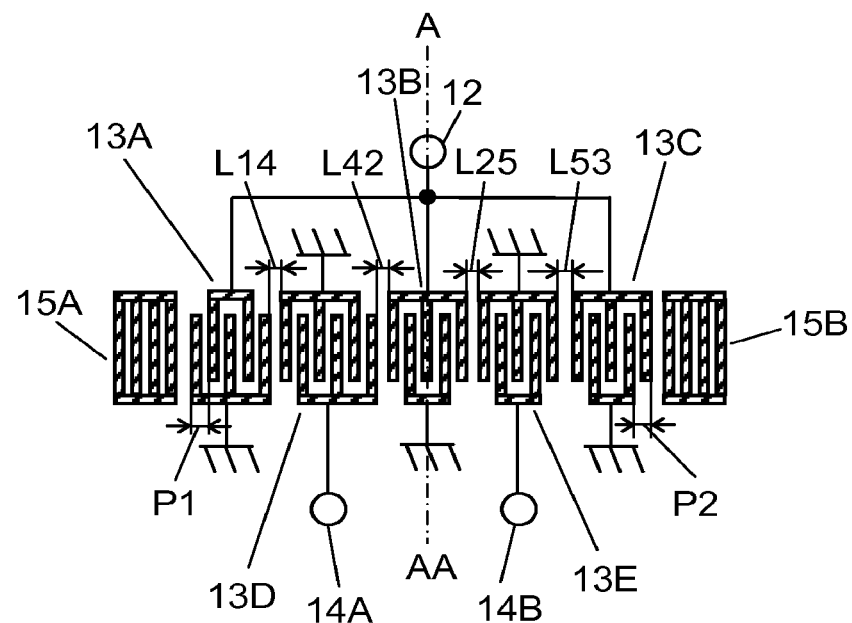
FIG. 1 is a schematic top view of an elastic wave filter in accordance with a first exemplary embodiment of the present invention.

FIG. 1 is a schematic top view of an elastic wave filter in accordance with the first exemplary embodiment of the present invention. With reference to FIG. 1, the elastic wave filter of this exemplary embodiment has unbalanced signal terminal 12; and first, second, and third interdigital transducer (IDT) electrodes 13A, 13B, and 13C whose wiring electrodes are electrically connected to unbalanced signal terminal 12. The elastic wave filter of this embodiment also has fourth IDT electrode 13D disposed between first and second IDT electrodes 13A and 13B. The elastic wave filter of this embodiment also has fifth IDT electrode 13E disposed between second and third IDT electrodes 13B and 13C. The elastic wave filter of this embodiment also has first balanced signal terminal 14A electrically connected to the wiring electrode of fourth IDT electrode 13D, and second balanced signal terminal 14B electrically connected to the wiring electrode of fifth IDT electrode 13E. In the elastic wave filter of this embodiment, the ground electrodes of first, second, third, fourth, and fifth IDT electrodes 13A, 13B, 13C, 13D, and 13E are electrically connected to the ground. In the elastic wave filter of this embodiment, a signal in opposite phase with a signal input from unbalanced signal terminal 12 is output from first balanced signal terminal 14A. In the elastic wave filter of this embodiment, a signal in phase with the signal input from unbalanced signal terminal 12 is output from second balanced signal terminal 14B. In the elastic wave filter of this embodiment, the wiring electrodes of second and third IDT electrodes 13B and 13C are adjacent to the ground electrode of fifth IDT electrode 13E. In the elastic wave filter of this embodiment, the wiring electrode of one of first and second IDT electrodes 13A and 13B is adjacent to the wiring electrode of fourth IDT electrode 13D. In the elastic wave filter of this embodiment, the ground electrode of the other of first and second IDT electrodes 13A and 13B is adjacent to the ground electrode of fourth IDT electrode 13D.

Specifically, each of first, second, third, and fifth IDT electrodes 13A, 13B, 13C, and 13E has five electrode fingers. Fourth IDT electrode 13D has six electrode fingers. The electrode fingers of each of first, second, third, fourth, and fifth IDT electrodes 13A, 13B, 13C, 13D, and 13E are formed of a wiring electrode and a ground electrode. In first IDT electrode 13A, the ground electrode is disposed on the outermost side such that this ground electrode is adjacent to the ground electrode in fourth IDT electrode 13D. The number of electrode fingers of fourth IDT electrode 13D is an even number. Thus, the electrode finger on the opposite side of the ground electrode adjacent to first IDT electrode 13A is a wiring electrode. This wiring electrode of fourth IDT electrode 13D is electrically connected to first balanced signal terminal 14A, and is adjacent to the wiring electrode of second IDT electrode 13B.

In second IDT electrode 13B, the number of electrode fingers is an odd number. Thus, the electrode finger on the opposite side of the wiring electrode adjacent to fourth IDT electrode 13D is a wiring electrode. This wiring electrode is adjacent to the ground electrode of fifth IDT electrode 13E. The wiring electrode of fifth IDT electrode 13E is electrically connected to second balanced signal terminal 14B.

In fifth IDT electrode 13E, the number of electrode fingers is an odd number. Thus, the electrode finger on the opposite side of the ground electrode adjacent to second IDT electrode 13B is also a ground electrode. This ground electrode is adjacent to the wiring electrode of third IDT electrode 13C.

Reflector 15A is disposed on the opposite side of fourth IDT electrode 13D with respect to first IDT electrode 13A. Reflector 15B is disposed on the opposite side of fifth IDT electrode 13E with respect to third IDT electrode 13C.

Such a configuration can suppress the occurrence of spuriousness in the bandpass.

Figure 3:
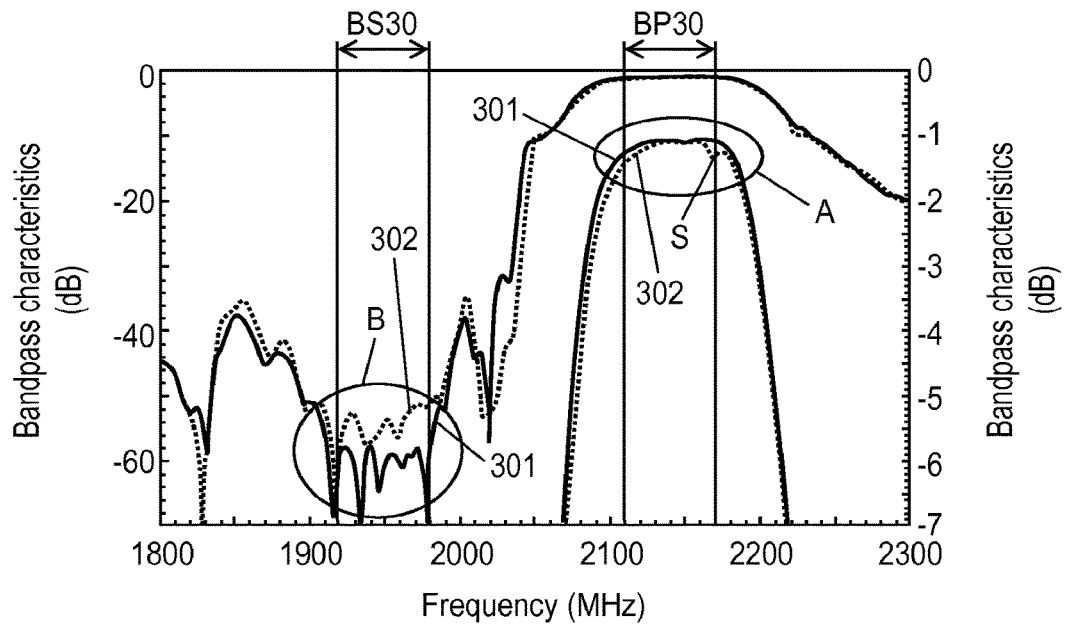
FIG. 3 is a chart showing bandpass characteristics of the elastic wave filter in accordance with the first exemplary embodiment.

FIG. 3 is a chart showing bandpass characteristics of the elastic wave filter in accordance with this exemplary embodiment. In FIG. 3, characteristics 301 shown by the solid lines are those of this exemplary embodiment, and characteristics 302 shown by the dotted lines are those (the same as shown in FIG. 15) of a conventional elastic wave filter. As shown in the "A" part of FIG. 3, for characteristics 301 of the elastic wave filter of this exemplary embodiment, spuriousness "S" appearing in conventional characteristics 302 has disappeared in the bandpass characteristics.

Further, as shown in the "B" part of FIG. 3, the attenuation characteristics in characteristics 301 (of this exemplary embodiment) can be improved, in comparison with those in (conventional) characteristics 302, by using at least one of the following three configurations.

The first configuration is related to a pitch spacing between the electrode fingers in first, second, third, fourth, and fifth IDT electrodes 13A, 13B, 13C, 13D, and 13E. This is a configuration where, with respect to center line A-AA in second IDT electrode 13B, pitch spacing P1 on one side and pitch spacing P2 on the other side are asymmetric.

The second configuration is related to a pitch gradation of the electrode fingers in first, second, third, fourth, and fifth IDT electrodes 13A, 13B, 13C, 13D, and 13E. This is a configuration where, with respect to center line A-AA in second IDT electrode 13B, the pitch gradation of pitch spacings P1 on one side and the pitch gradation of pitch spacings P2 on the other side are asymmetric. In this configuration, for example, pitch spacings P1 in the pitch gradation on one side are gradually reduced by spacing $\alpha$ as the distance from center line A-AA is increased, and pitch spacings P2 in the pitch gradation on the other side are gradually reduced by spacing $\beta(\neq\alpha)$ as the distance from center line A-AA is increased.

The third configuration is related to spacing between first, second, third, fourth, and fifth IDT electrodes 13A, 13B, 13C, 13D, and 13E. This is a configuration where at least one of spacing L14 between first IDT electrode 13A and fourth IDT electrode 13D and spacing L42 between fourth IDT electrode 13D and second IDT electrode 13B is different from at least one of spacing L25 between second IDT electrode 13B and fifth IDT electrode 13E and spacing L53 between fifth IDT electrode 13E and third IDT electrode 13C.

Figure 2:
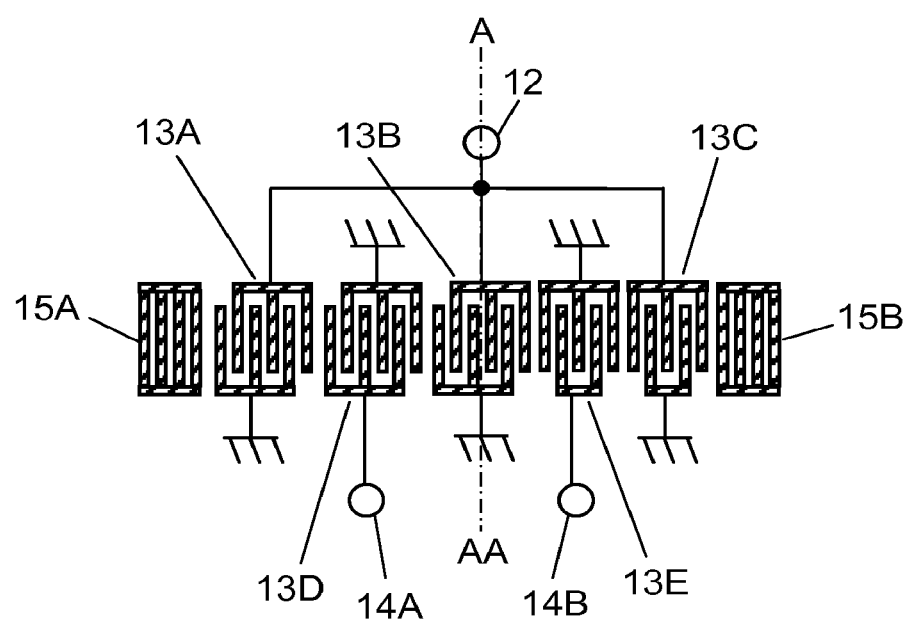
FIG. 2 is a schematic top view of an elastic wave filter in accordance with another example of the first exemplary embodiment.

In this exemplary embodiment, second IDT electrode 13B has an odd number of electrode fingers. Thus, the ground electrode of first IDT electrode 13A is adjacent to the ground electrode of fourth IDT electrode 13D, and the wiring electrode of fourth IDT electrode 13D is adjacent to the wiring electrode of second IDT electrode 13B. However, as shown in FIG. 2, second IDT electrode 13B may have an even number of electrode fingers. In this case, the wiring electrode of first IDT electrode 13A is adjacent to the wiring electrode of fourth IDT electrode 13D, and the ground electrode of fourth IDT electrode 13D is adjacent to the ground electrode of second IDT electrode 13B.

Figure 4:
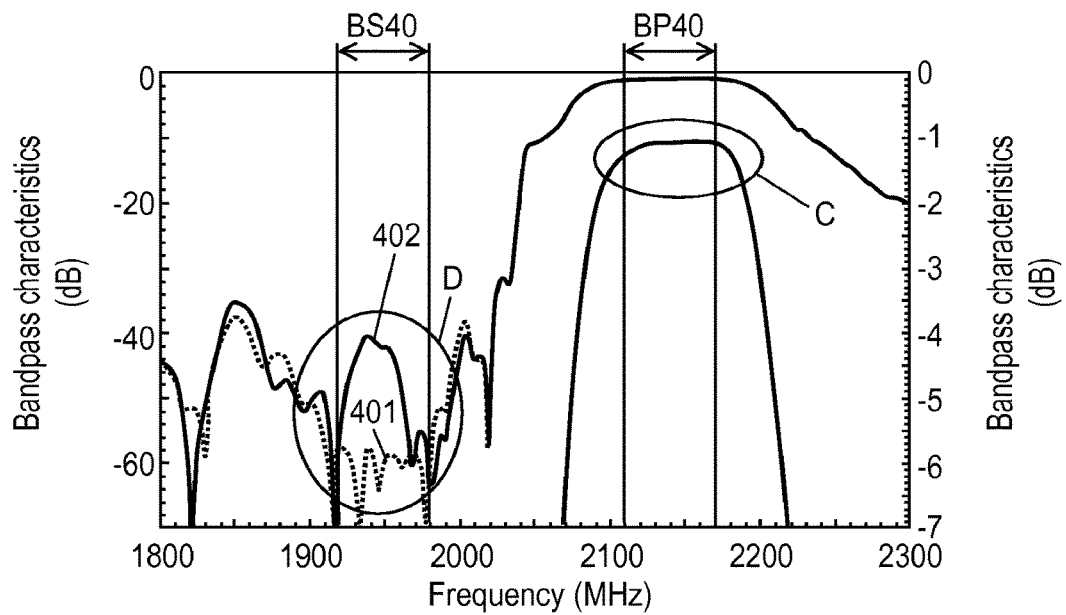
FIG. 4 is a chart showing bandpass characteristics of the elastic wave filter of FIG. 2.

However, the configuration of FIG. 1 is preferable in terms of improvement in attenuation characteristics. FIG. 4 is a chart showing bandpass characteristics of the elastic wave filter of FIG. 2. In FIG. 4, characteristics 402 of the elastic wave filter configured as shown in FIG. 2 is superimposed on characteristics 401 of the elastic wave filter configured as shown in FIG. 1. As obvious from FIG. 4, attenuation characteristics in characteristics 401 are improved in comparison with those in characteristics 402. Therefore, a more preferable configuration where attenuation characteristics are further improved is that of FIG. 1, where second IDT electrode 13B has an odd number of electrode fingers, the ground electrode of first IDT electrode 13A is adjacent to the ground electrode of fourth IDT electrode 13D, and the wiring electrode of fourth IDT electrode 13D is adjacent to the wiring electrode of second IDT electrode 13B.

With a configuration where the arrangement of the electrode fingers of the elastic wave filter of FIG. 1 is vertically inverted, the same advantages can be obtained. In this case, the connection relations between unbalanced signal terminal 12, first balanced signal terminal 14A, second balanced signal terminal 14B, and respective electrode fingers are the same as those shown in FIG. 1. With this configuration, the ground electrodes of second and third IDT electrodes 13B and 13C are adjacent to the wiring electrode of fifth IDT electrode 13E, the wiring electrode of one of first and second IDT electrodes 13A and 13B is adjacent to the wiring electrode of fourth IDT electrode 13D, and the ground electrode of the other of first and second IDT electrodes 13A and 13B is adjacent to the ground electrode of fourth IDT electrode 13D.

Second Exemplary Embodiment

In the elastic wave filter of the second exemplary embodiment of the present invention, the bandpass characteristics can be further improved by parallel-connecting the elastic wave filters described in the first exemplary embodiment.

Figure 5:
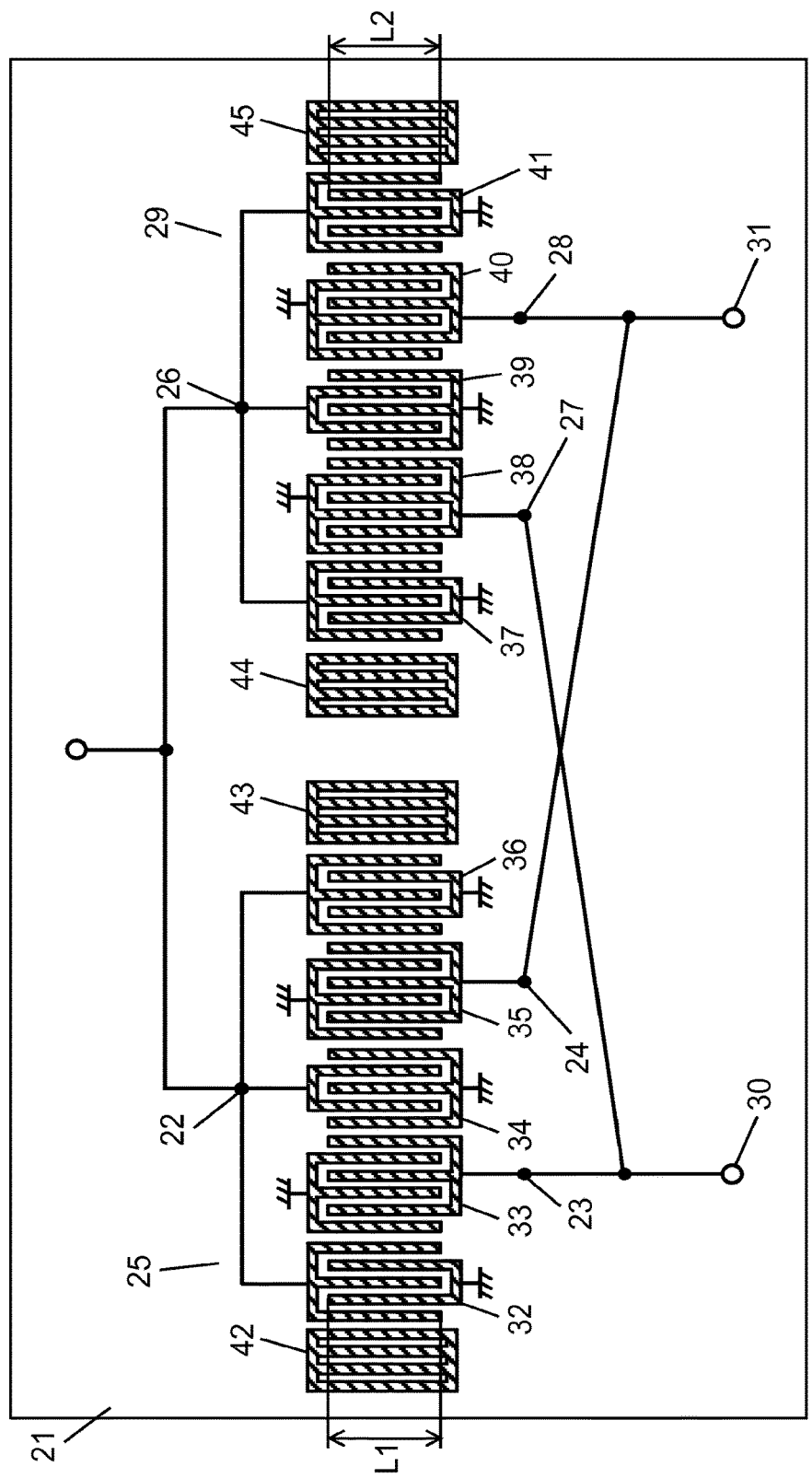
FIG. 5 is a schematic top view of a parallel-connected elastic wave filter in accordance with a second exemplary embodiment of the present invention.

A parallel-connected elastic wave filter of this exemplary embodiment is described with reference to the accompanying drawings. As shown in FIG. 5, the parallel-connected elastic wave filter of this exemplary embodiment has piezoelectric substrate 21, and first longitudinally coupled resonator elastic wave filter 25 and second longitudinally coupled resonator elastic wave filter 29 formed on piezoelectric substrate 21. The first longitudinally coupled resonator elastic wave filter has first unbalanced signal terminal 22, first balanced signal terminal 23, and second balanced signal terminal 24. Each of first unbalanced signal terminal 22, first balanced signal terminal 23, and second balanced signal terminal 24 is electrically connected to first longitudinally coupled resonator elastic wave filter 25. The second longitudinally coupled resonator elastic wave filter has second unbalanced signal terminal 26, third balanced signal terminal 27, and fourth balanced signal terminal 28. Each of second unbalanced signal terminal 26, third balanced signal terminal 27, and fourth balanced signal terminal 28 is electrically connected to second longitudinally coupled resonator elastic wave filter 29.

First unbalanced signal terminal 22 and second unbalanced signal terminal 26 are electrically connected to each other. First balanced signal terminal 23 and third balanced signal terminal 27 are electrically connected to first input/output terminal 30. Second balanced signal terminal 24 and fourth balanced signal terminal 28 are electrically connected to second input/output terminal 31.

The input/output signal from first input/output terminal 30 is 180° out of phase, i.e. in opposite phase, with the input/output signal from second input/output terminal 31. Actually, in consideration of design accuracy and variations, the phase difference between the input/output signal from first input/output terminal 30 and the input/output signal from second input/output terminal 31 is in the range of 180°±10°.

First longitudinally coupled resonator elastic wave filter 25 also has first, second, third, fourth, and fifth IDT electrodes 32, 33, 34, 35, and 36. The first longitudinally coupled resonator elastic wave filter has grating reflectors 42 and 43 at both ends of the arrangement of first, second, third, fourth, and fifth IDT electrodes 32, 33, 34, 35, and 36 in the propagation direction of elastic waves. Similarly, second longitudinally coupled resonator elastic wave filter 29 has sixth, seventh, eighth, ninth and tenth IDT electrodes 37, 38, 39, 40, and 41. The second longitudinally coupled resonator elastic wave filter has grating reflectors 44 and 45 at both ends of the arrangement of sixth, seventh, eighth, ninth and tenth IDT electrodes 37, 38, 39, 40, and 41 in the propagation direction of elastic waves.

One end of each of first, third, and fifth IDT electrodes 32, 34, and 36 is electrically connected to first unbalanced signal terminal 22, and the other end thereof is connected to the ground. Similarly, one end of each of sixth, eighth, and tenth IDT electrodes 37, 39, and 41 is electrically connected to second unbalanced signal terminal 26, and the other end thereof is connected to the ground.

That is, as shown in FIG. 5, in each of first, third, and fifth IDT electrodes 32, 34, and 36, one plurality of commonly connected electrode fingers faces the other plurality of commonly connected electrode fingers such that the former electrode fingers are disposed alternately with the latter electrode fingers. The one plurality of commonly connected electrode fingers in each of first and fifth IDT electrodes 32 and 36 and the one plurality of commonly connected electrode fingers in third IDT electrode 34 are electrically connected to first unbalanced signal terminal 22. The other plurality of commonly connected electrode fingers in each of first and fifth IDT electrodes 32 and 36 and the other plurality of commonly connected electrode fingers in third IDT electrode 34 are connected to the ground. As shown in FIG. 5, each of sixth, eighth, and tenth IDT electrodes 37, 39, and 41 has one plurality of commonly connected electrode fingers and the other plurality of commonly connected electrode fingers. The one plurality of commonly connected electrode fingers in each of sixth and tenth IDT electrodes 37 and 41, and the one plurality of commonly connected electrode fingers in eighth IDT electrode 39 are electrically connected to second unbalanced signal terminal 26. The other plurality of commonly connected electrode fingers in each of sixth and tenth IDT electrodes 37 and 41, and the other plurality of commonly connected electrode fingers in eighth IDT electrode 39 are connected to the ground.

One end of second IDT electrode 33 is connected to the ground, and the other end thereof is electrically connected to first balanced signal terminal 23. One end of seventh IDT electrode 38 is connected to the ground, and the other end thereof is electrically connected to third balanced signal terminal 27. As described above, first balanced signal terminal 23 and third balanced signal terminal 27 are electrically connected to first input/output terminal 30.

On the other hand, one end of fourth IDT electrode 35 is connected to the ground, and the other end thereof is electrically connected to second balanced signal terminal 24. One end of ninth IDT electrode 40 is connected to the ground, and the other end thereof is electrically connected to fourth balanced signal terminal 28. As described above, second balanced signal terminal 24 and fourth balanced signal terminal 28 are electrically connected to second input/output terminal 31.

That is, as shown in FIG. 5, in each of second, fourth, seventh, and ninth IDT electrodes 33, 35, 38, and 40, one plurality of commonly connected electrode fingers faces the other plurality of commonly connected electrode fingers such that the former electrode fingers are disposed alternately with the latter electrode fingers. At one end of each of second and seventh IDT electrodes 33 and 38, the one plurality of commonly connected electrode fingers is connected to the ground. In second IDT electrode 33, the other plurality of commonly connected electrode fingers is electrically connected to first balanced signal terminal 23. In seventh IDT electrode 38, the other plurality of commonly connected electrode fingers is electrically connected to third balanced signal terminal 27. In each of fourth and ninth IDT electrodes 35 and 40, the one plurality of commonly connected electrode fingers is connected to the ground. In fourth IDT electrode 35, the other plurality of commonly connected electrode fingers is electrically connected to second balanced signal terminal 24. In ninth IDT electrode 40, the other plurality of commonly connected electrode fingers is electrically connected to fourth balanced signal terminal 28.

The input/output signal from first balanced signal terminal 23 is in opposite phase with the input/output signal from second balanced signal terminal 24. Further, the input/output signal from third balanced signal terminal 27 is in opposite phase with the input/output signal from fourth balanced signal terminal 28.

The input/output signal from first balanced signal terminal 23 is in phase with the input/output signal from third balanced signal terminal 27. Further, the input/output signal from second balanced signal terminal 24 is in phase with the input/output signal from fourth balanced signal terminal 28.

With this configuration, the input/output signal from first input/output terminal 30 is in opposite phase with the input/output signal from second input/output terminal 31.

In this exemplary embodiment, this configuration can suppress spuriousness in the high-frequency part of the desired band, and thus reduce the insertion loss degradation.

Figure 6:
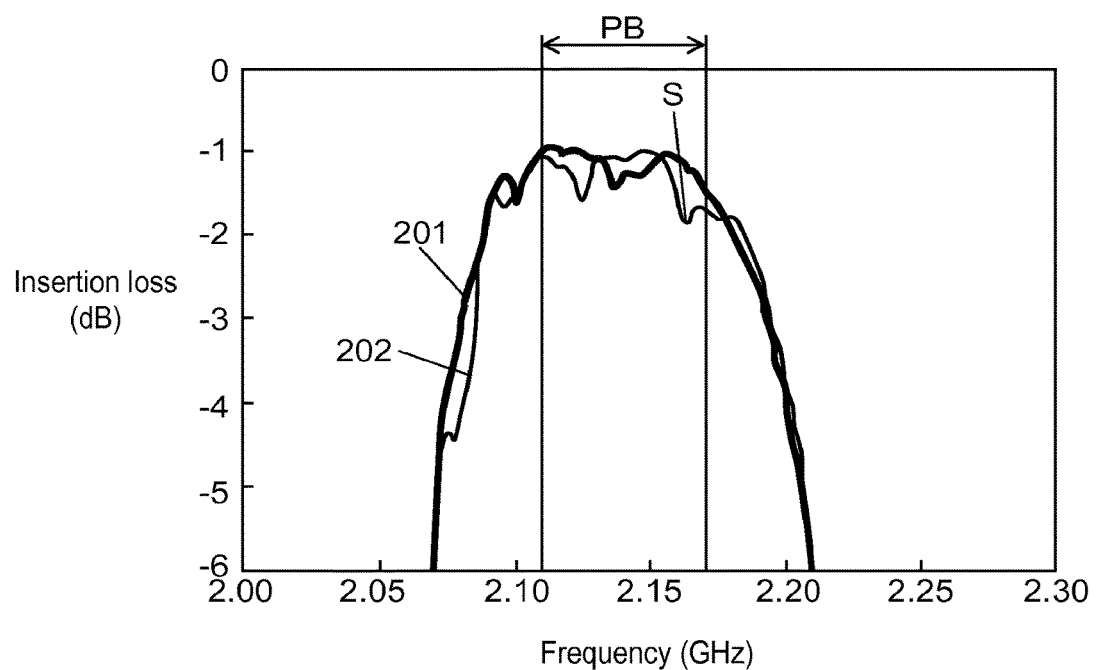
FIG. 6 is a chart showing bandpass characteristics of the parallel-connected elastic wave filter in accordance with the second exemplary embodiment.

FIG. 6 is a chart showing bandpass characteristics of the parallel-connected elastic wave filter in accordance with this exemplary embodiment. The horizontal axis shows a frequency and the vertical axis shows bandpass characteristics of the filter at the frequency. FIG. 6 shows characteristics 201 of this exemplary embodiment and characteristics 202 of a conventional example. As shown in FIG. 6, when desired bandpass PB is the frequency range of 2.11 GHz to 2.17 GHz, spuriousness "S" in the high-frequency part thereof is suppressed and thus the insertion loss degradation is reduced in characteristics 201 (shown by the thick line) of this exemplary embodiment. Specifically, while the insertion loss at a frequency of 2.17 GHz in the high-frequency part is 1.8 dB in characteristics 202 (shown by the thin line) of the conventional example, that in characteristics 201 of this exemplary embodiment is improved to 1.4 dB.

As piezoelectric substrate 21 shown in FIG. 5, a piezoelectric substrate having piezoelectric properties can be used. Examples of the piezoelectric substrate include a Y-cut X-propagation $LiNbO_3$ substrate, and a $LiNbO_3$ substrate, $LiYaO_3$ substrate, and crystal substrate having other cut angles.

Usable materials of the electrodes formed on piezoelectric substrate 21 are metals, such as aluminum, or alloys thereof.

Each of first and second longitudinally coupled resonator elastic wave filter 25 and 29 of this exemplary embodiment has five IDT electrodes arranged in the propagation direction of elastic waves. However, the number of IDT electrodes is not limited to this value as long as one unbalanced signal can be converted into two balanced signals.

The electrodes in first and second longitudinally coupled resonator elastic wave filters 25 and 29 of this exemplary embodiment are designed to have an identical configuration. However, the configuration of the electrodes does not need to be identical as long as each longitudinally coupled resonator elastic wave filter can convert one unbalanced signal into two balanced signals.

It is preferable that the polarity of the electrode fingers in IDT electrodes 32 and 36 at the outermost ends of IDT electrodes 32 through 36 in first longitudinally coupled resonator elastic wave filter 25 is equal to the polarity of the electrode fingers in IDT electrodes 37 and 41 at the outermost ends of IDT electrodes 37 through 41 in second longitudinally coupled resonator elastic wave filter 29. Such polarity can be obtained by making the combination of the comb-shaped electrodes of respective IDT electrodes 32 through 36 in first longitudinally coupled resonator elastic wave filter 25 identical with the combination of the comb-shaped electrodes of respective IDT electrodes 37 through 41 in second longitudinally coupled resonator elastic wave filter 29.

That is, the combination of the comb-shaped electrodes is made identical in the pairs of IDT electrodes 32 and 37, IDT electrodes 33 and 38, IDT electrodes 34 and 39, IDT electrodes 35 and 40, and IDT electrodes 36 and 41. This configuration can make the input/output signal from first balanced signal terminal 23 in phase with the input/output signal from third balanced signal terminal 27, and the input/output signal from second balanced signal terminal 24 in phase with the input/output signal from fourth balanced signal terminal 28. Thus, the parallel-connected elastic wave filter of this exemplary embodiment can be implemented easily.

Overlapping width L1 in first longitudinally coupled resonator elastic wave filter 25 is set larger than overlapping width L2 in second longitudinally coupled resonator elastic wave filter 29. This configuration can effectively distribute the frequencies at which transverse-mode spuriousness occurs.

Third Exemplary Embodiment

Figure 7:
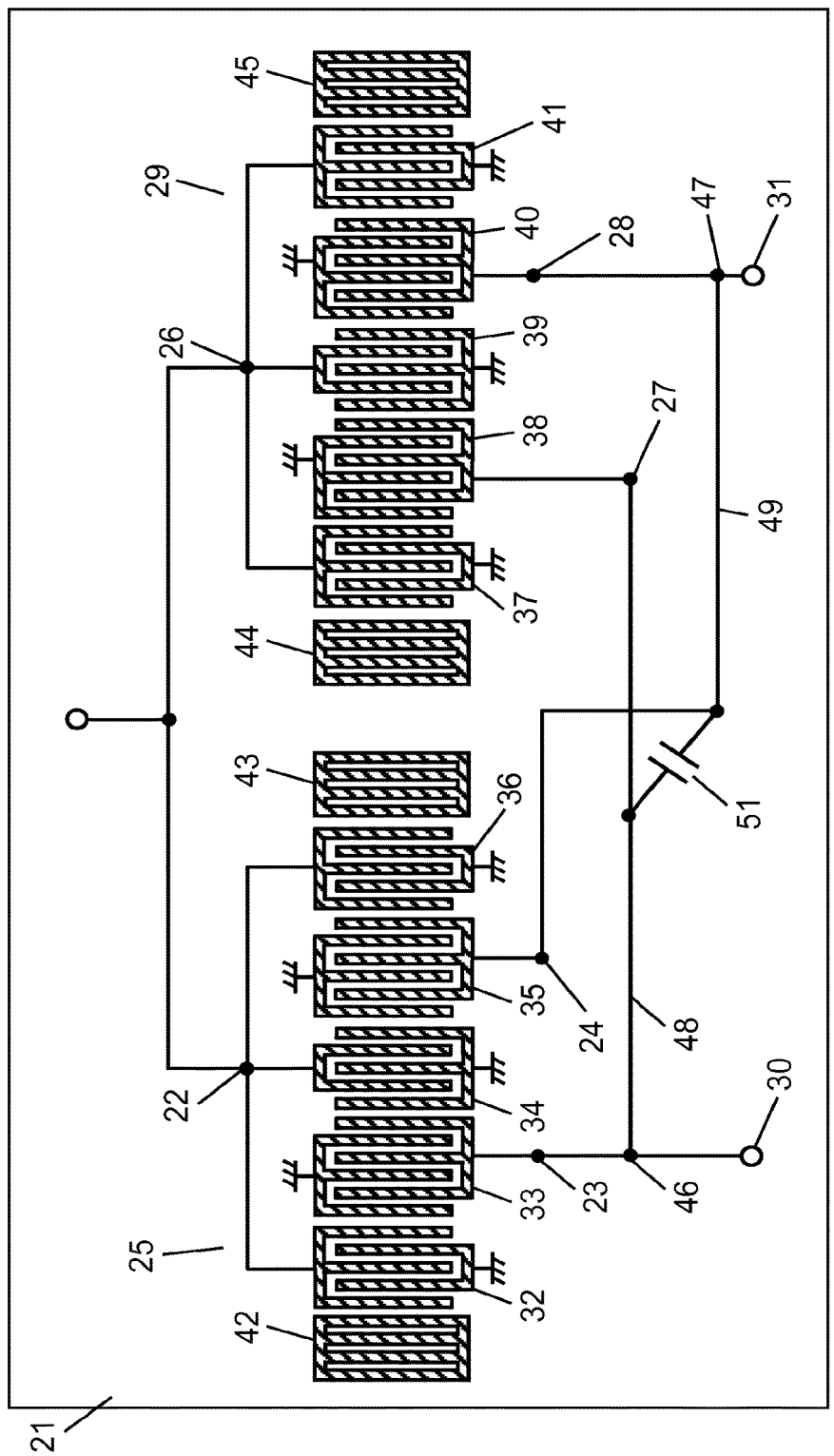
FIG. 7 is a schematic top view of a parallel-connected elastic wave filter in accordance with a third exemplary embodiment of the present invention.

FIG. 7 is a schematic top view showing a parallel-connected elastic wave filter in accordance with the third exemplary embodiment of the present invention. In the parallel-connected elastic wave filter of this exemplary embodiment, as shown in FIG. 7, capacitance component 51 is interposed between first input/output terminal 30 and second input/output terminal 31 of the parallel-connected elastic wave filter of the second exemplary embodiment.

That is, first balanced signal terminal 23 and third balanced signal terminal 27 are connected to first junction point 46. Second balanced signal terminal 24 and fourth balanced signal terminal 28 are connected to second junction point 47. First junction point 46 and third balanced signal terminal 27 are connected by first wiring 48. Second junction point 47 and second balanced signal terminal 24 are connected by second wiring 49.

Figure 8:
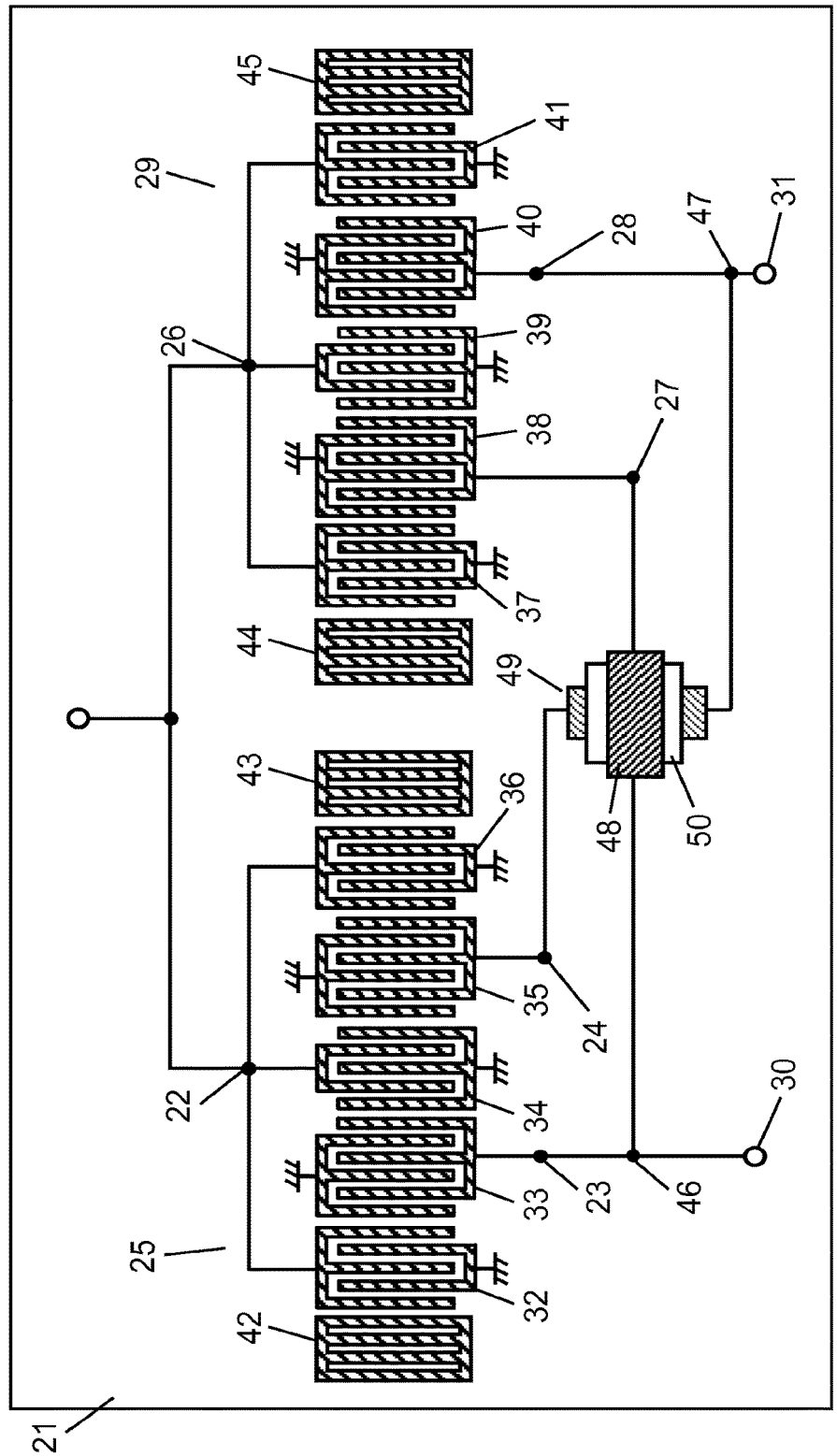
FIG. 8 is a top view showing a specific example of the parallel-connected elastic wave filter in accordance with the third exemplary embodiment.
Figure 9:
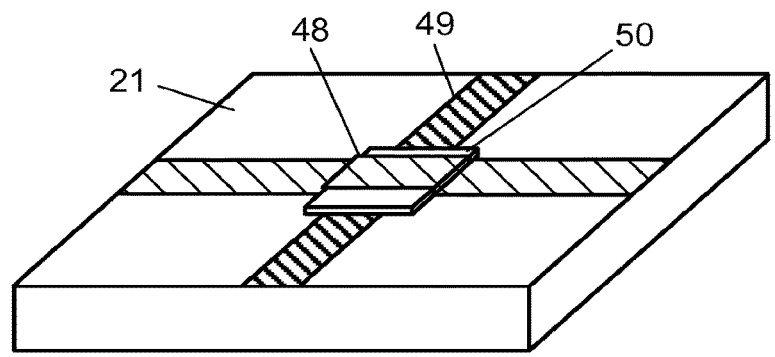
FIG. 9 is a perspective view of an essential part of the parallel-connected elastic wave filter of FIG. 8.

The configuration of FIG. 7 can be obtained as specifically shown in FIG. 8 and FIG. 9, for example. FIG. 8 is a top view of a specific configuration of FIG. 7, and FIG. 9 is a perspective view of an essential part thereof. That is, first wiring 48 and second wiring 49 are crossed each other on piezoelectric substrate 21. Between first wiring 48 and second wiring 49, dielectric film 50 is formed. With this configuration, capacitance component 51 can be interposed between first input/output terminal 30 and second input/output terminal 31, as shown in FIG. 7.

With this configuration, the impedance with respect to first input/output terminal 30 can be matched to the impedance with respect to second input/output terminal 31.

Preferably, silicon oxide is used as dielectric film 50. Since a silicon oxide film can be manufactured at a low temperature, damage to the elements can be avoided. Further, the silicon oxide film works as dielectric film 50 having high precision and quality whose thickness is easily controllable.

Dielectric film 50 covers the top surface of at least one of first longitudinally coupled resonator elastic wave filter 25 and second longitudinally coupled resonator elastic wave filter 29. Further, preferably, the dielectric film serves as a functional film of at least one of first longitudinally coupled resonator elastic wave filter 25 and second longitudinally coupled resonator elastic wave filter 29.

For example, specifically, dielectric film 50 interposed between first wiring 48 and second wiring 49 covers first, second, third, fourth, and fifth IDT electrodes 32, 33, 34, 35, and 36 and/or sixth, seventh, eighth, ninth, and tenth IDT electrodes 37, 38, 39, 40, and 41, and serves as a functional film thereof.

That is, a functional film of silicon oxide, for example, is formed on first, second, third, fourth, fifth, sixth, seventh, eighth, ninth, and tenth IDT electrodes 32, 33, 34, 35, 36, 37, 38, 39, 40, and 41, for example. Thus, the functional film can serve as a protective film of the IDT electrodes. Further, the film can suppress unnecessary spuriousness occurring in the vicinity of the resonance frequency, and improve frequency-temperature characteristics. This functional film is extended to the portion between first wiring 48 and second wiring 49 in a position different from that of IDT electrodes, so that the functional film can also be used as dielectric film 50. Thus, the productivity can be enhanced.

When $LiTaO_3$ is used for the piezoelectric substrate, unnecessary spuriousness occurring in the vicinity of the resonance frequency is small. Thus, the functional film and dielectric film 50 may be formed in common, using a resin-based material having high processability, such as polyimide.

Fourth Exemplary Embodiment

Figure 10:
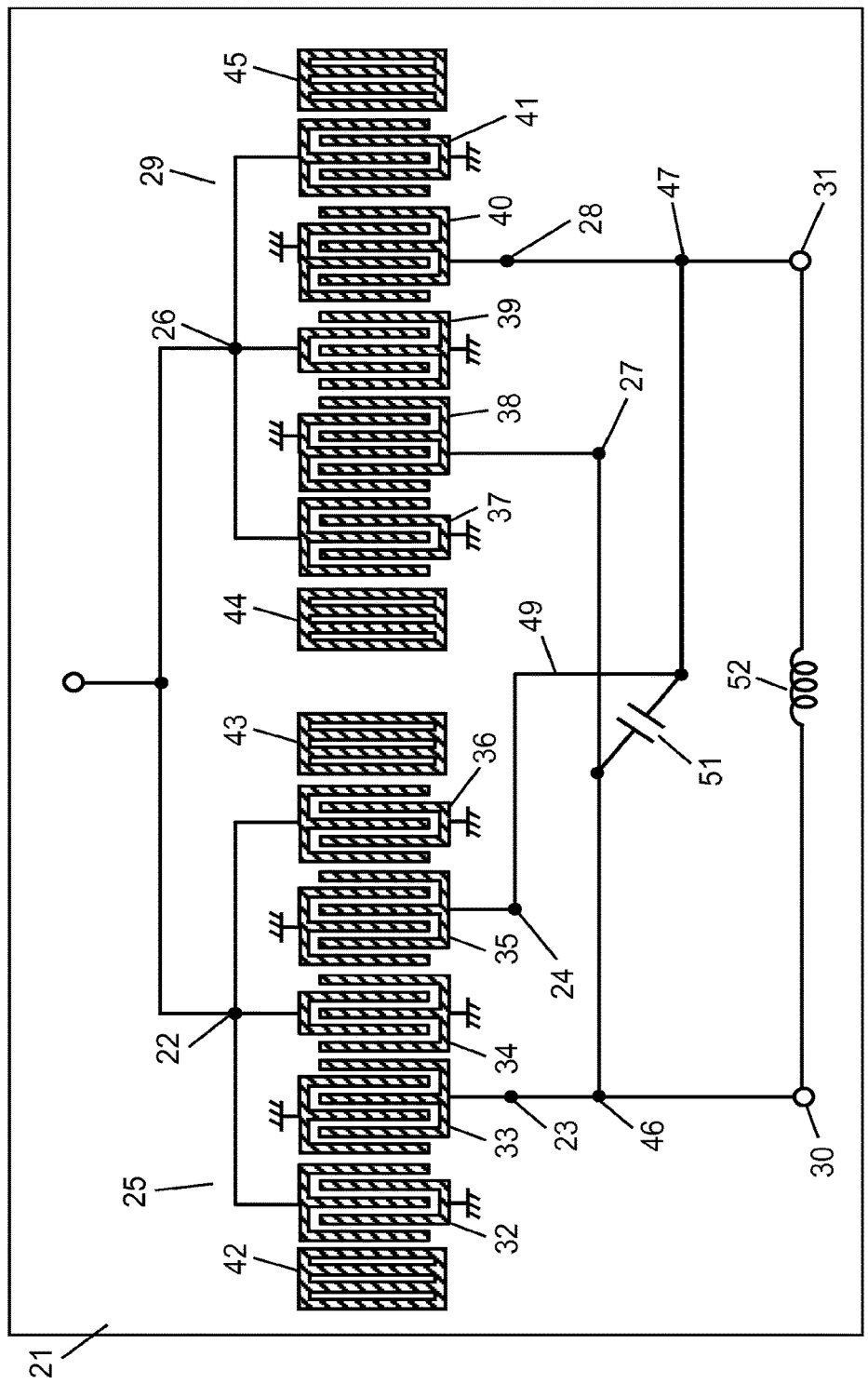
FIG. 10 is a schematic top view of a parallel-connected elastic wave filter in accordance with a fourth exemplary embodiment of the present invention.

FIG. 10 is a schematic top view showing a parallel-connected elastic wave filter in accordance with the fourth exemplary embodiment of the present invention. In the parallel-connected elastic wave filter of this exemplary embodiment, as shown in FIG. 10, inductance component 52 is interposed between first input/output terminal 30 and second input/output terminal 31 of the parallel-connected elastic wave filter of the second exemplary embodiment.

For example, a laminated inductor or a thin-film inductor is disposed between first input/output terminal 30 and second input/output terminal 31 so as to be electrically connected thereto at both ends. Thereby, inductance component 52 is interposed between the input/output terminals.

Inductance component 52 interposed between first input/output terminal 30 and second input/output terminal 31 enables impedance matching. Thus, the capacitance value necessary for the impedance matching can be reduced. As a result, the crossing area between first wiring 48 and second wiring 49 as shown in FIG. 8 and FIG. 9 can be reduced, and the filter can be downsized.

Fifth Exemplary Embodiment

Figure 11:
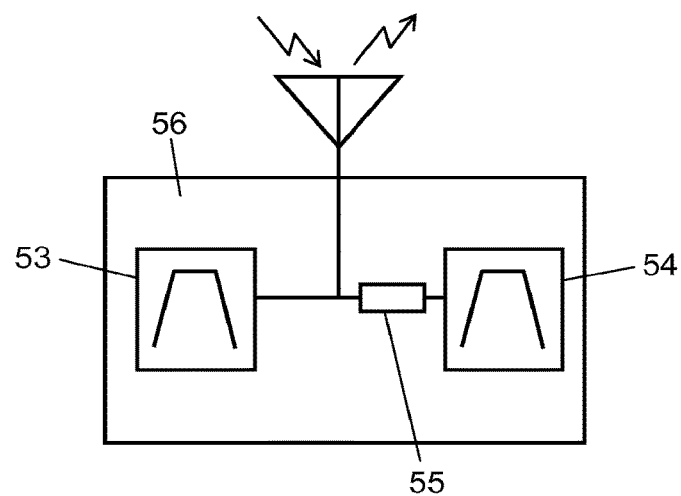
FIG. 11 is an electric circuit diagram of a duplexer in accordance with a fifth exemplary embodiment of the present invention.

Hereinafter, a description is provided for a duplexer in accordance with the fifth exemplary embodiment of the present invention, with reference to the accompanying drawings. FIG. 11 is an electric circuit diagram of the duplexer in accordance with this exemplary embodiment.

As shown in FIG. 11, diplexer 56 of this exemplary embodiment has transmission elastic wave filter 53, reception elastic wave filter 54, and phase-shift circuit 55 electrically connected to transmission elastic wave filter 53 and reception elastic wave filter 54. Reception elastic wave filter 54 of this exemplary embodiment is formed of a parallel-connected elastic wave filter described in the second exemplary embodiment.

Figure 12:
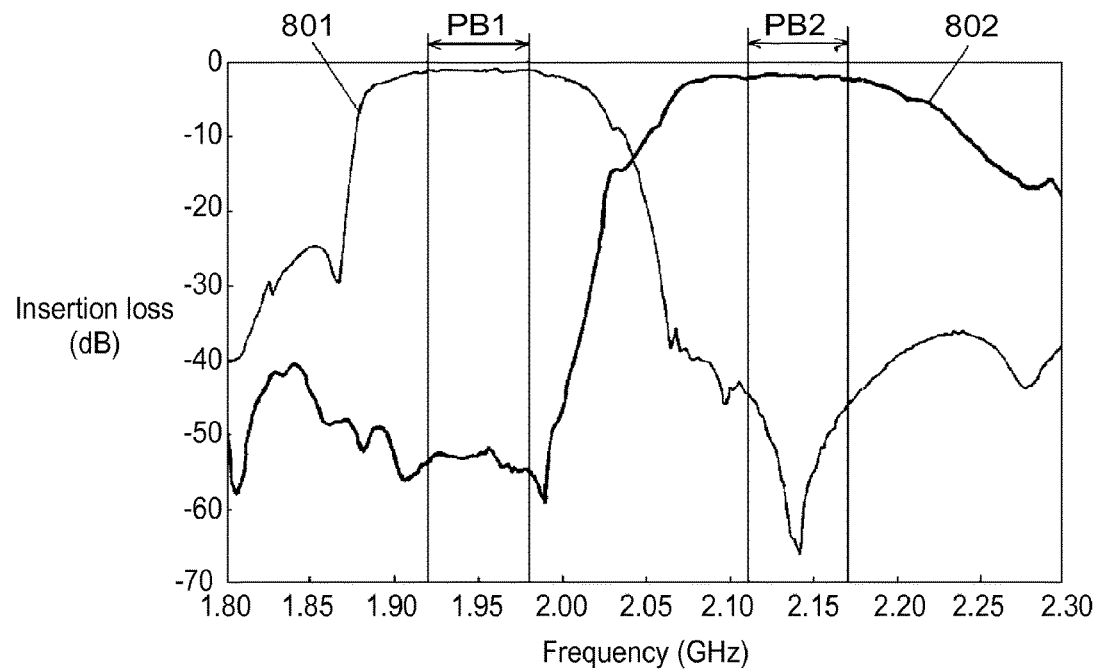
FIG. 12 is a chart showing bandpass characteristics in accordance with the fifth exemplary embodiment.

FIG. 12 shows bandpass characteristics of an antenna duplexer for Wideband Code Division Multiple Access (WCDMA) that includes duplexer 56. FIG. 12 shows transmission bandpass characteristics 801 for transmission bandpass PB1 and reception bandpass characteristics 802 for reception bandpass PB2. FIG. 12 shows that an excellent insertion loss of approximately −2.1 dB is achieved in reception bandpass PB2 (2.11 GHz to 2.17 GHz).

In this manner, a parallel-connected elastic wave filter described in the second exemplary embodiment is used as at least one of reception elastic wave filter 54 and transmission elastic wave filter 53. Thereby, duplexer 56 having a low insertion loss can be obtained.

Sixth Exemplary Embodiment

Figure 13:
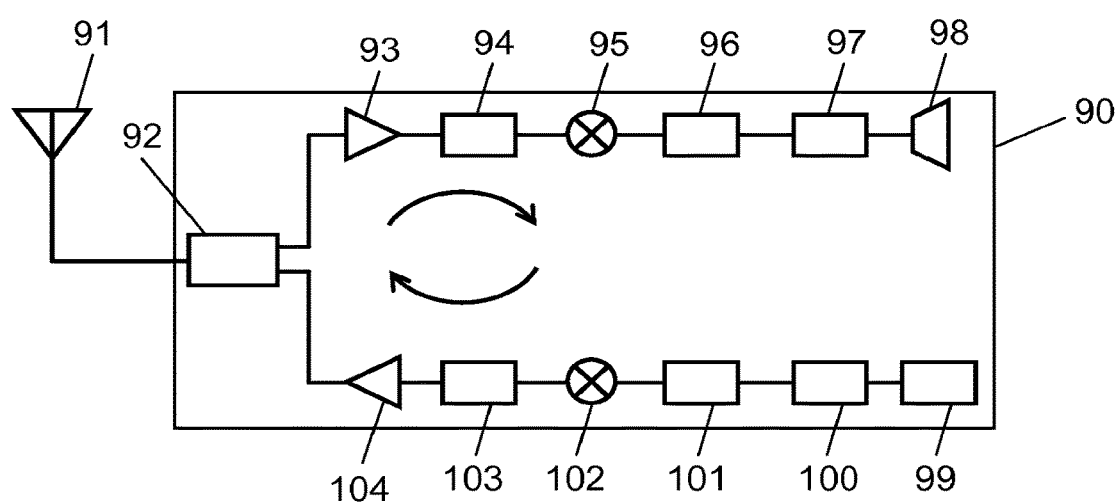
FIG. 13 is a configuration diagram of an electronic device in accordance with a sixth exemplary embodiment of the present invention.

FIG. 13 is a configuration diagram of an electronic device in accordance with the sixth exemplary embodiment of the present invention. In this exemplary embodiment, as the electronic device, a configuration of portable phone 90 is shown. With reference to FIG. 13, a reception signal at a frequency of 2.0 GHz received by antenna 91 is assigned to the reception side by duplexer 92, and sent to elastic wave filter 94 in a first stage via low-noise amplifier 93. The signal whose noise is removed by elastic wave filter 94 is sent to mixer 95, where the frequency of the signal is reduced to 130 MHz. Then, the signal is sent to elastic wave filer 96 in a second stage. In elastic wave filter 96, a signal is taken out with a low insertion loss. Thus, a voice signal can be heard via demodulator circuit 97 from speaker 98.

On the other hand, a voice input to microphone 99 is converted into a digital signal by A/D converter 100, phase-modulated by modulator 101, and input to mixer 102. The signal whose frequency is increased by mixer 102 is input to elastic wave filter 103. The signal whose noise is removed by elastic wave filter 103 is transmitted, as a transmission signal at a frequency of 2.0 GHz, via power amplifier 104 and duplexer 92, from antenna 91.

In this manner, a parallel-connected elastic wave filter described in the second exemplary embodiment is used as elastic wave filters 92, 94, 96, and 103 in portable phone 90, for example. Thereby, portable phone 90 having a low insertion loss can be obtained. That is, the listening quality of portable phone 90 can be improved.

INDUSTRIAL APPLICABILITY

The present invention has advantages of suppressing spuriousness in a high-frequency part of the band and reducing the insertion loss degradation, and thus is useful in various electronic devices, such as a portable phone.

What is claimed is:
1. An elastic wave filter comprising:
an unbalanced signal terminal, a first balanced signal terminal, and a second balanced signal terminal;
a pair of grating reflectors;
first, second, third, fourth, and fifth interdigital transducer (IDT) electrodes arranged in ordinal order between the pair of grating reflectors and each having a wiring electrode and a ground electrode electrically connected to ground, the wiring electrodes of the third and fifth IDT electrodes being disposed adjacent to the ground electrode of the fourth IDT electrode, the wiring electrode of the second IDT electrode being disposed adjacent to the wiring electrode of the third IDT electrode, and the ground electrode of the first IDT electrode being disposed adjacent to the ground electrode of the second IDT electrode, the unbalanced signal terminal being connected to the wiring electrode of each of the first, third, and fifth IDT electrodes, the first balanced signal terminal being electrically connected to the wiring electrode of the second IDT electrode, and the second balanced signal terminal being electrically connected to the wiring electrode of the fourth IDT electrode, a first pitch gradation of pitch spacing between electrode fingers in each of the first IDT electrode, the second IDT electrode, and the third IDT electrode on a first side of a center line in the third IDT electrode being gradually reduced by a first spacing α as a distance from the center line increases, and a second pitch gradation of pitch spacing between electrode fingers in each of the fourth IDT electrode and the fifth IDT electrode and the electrode fingers in the third IDT electrode on a second side of the center line being gradually reduced by a second spacing β as the distance from the center line increases, where α and β are different.

2. The elastic wave filter of claim 1 wherein the third IDT electrode has an odd number of electrode fingers.

3. The elastic wave filter of claim 1 wherein a first spacing between the first IDT electrode and the second IDT electrode is different from a second spacing between the fourth IDT electrode and the fifth IDT electrode.

4. The elastic wave filter of claim 1 wherein a first spacing between the first IDT electrode and the second IDT electrode is different from a second spacing between the third IDT electrode and the fourth IDT electrode.

5. The elastic wave filter of claim 1 wherein a first spacing between the second IDT electrode and the third IDT electrode is different from a second spacing between the fourth IDT electrode and the fifth IDT electrode.

6. The elastic wave filter of claim 1 wherein a first spacing between the second IDT electrode and the third IDT electrode is different from a second spacing between the third IDT electrode and the fourth IDT electrode.

7. The elastic wave filter of claim 1 wherein the pitch spacing between the electrode fingers in each of the first IDT electrode, the second IDT electrode, and the third IDT electrode on the first side of the center line in the third IDT electrode and the pitch spacing between the electrode fingers in each of the third IDT electrode, the fourth IDT electrode, and the fifth IDT on the second side of the center line are asymmetric.

8. An elastic wave device comprising:
a first elastic wave filter; and
a second elastic wave filter connected in parallel with the first elastic wave filter, each of the first and second elastic wave filters being the elastic wave filter of claim 1.

9. A duplexer comprising:
a reception elastic wave filter, the reception elastic wave filter being the elastic wave device of claim 8;
a transmission elastic wave filter; and a phase-shift circuit electrically connected between the transmission elastic wave filter and the reception elastic wave filter.

10. An elastic wave filter comprising:
an unbalanced signal terminal, a first balanced signal terminal, and a second balanced signal terminal;
a pair of grating reflectors;
first, second, third, fourth, and fifth interdigital transducer (IDT) electrodes arranged in ordinal order between the pair of grating reflectors and each having a wiring electrode and a ground electrode electrically connected to ground, the wiring electrodes of the third and fifth IDT electrodes being disposed adjacent to the ground electrode of the fourth IDT electrode, the wiring electrode of one of the first IDT electrode and the third IDT electrode being disposed adjacent to the to the wiring electrode of the second IDT electrode, and the ground electrode of the other of the first IDT electrode and the third IDT electrode being disposed adjacent to the ground electrode of the second IDT electrode, the unbalanced signal terminal being connected to the wiring electrode of each of the first, third, and fifth IDT electrodes, the first balanced signal terminal being electrically connected to the wiring electrode of the second IDT electrode, and the second balanced signal terminal being electrically connected to the wiring electrode of the fourth IDT electrode, a first pitch gradation of pitch spacing between electrode fingers in each of the first IDT electrode, the second IDT electrode, and the third IDT electrode on a first side of a center line in the third IDT electrode being gradually reduced by a first spacing $\alpha$ as a distance from the center line increases, and a second pitch gradation of pitch spacing between electrode fingers in each of the fourth IDT electrode and the fifth IDT electrode and the electrode fingers in the third IDT electrode on a second side of the center line being gradually reduced by a second spacing $\beta$ as the distance from the center line increases, where $\alpha$ and $\beta$ are different.

11. The elastic wave filter of claim 10 wherein the wiring electrode of the first IDT electrode is disposed adjacent to the wiring electrode of the second IDT electrode, and the ground electrode of the third IDT electrode is disposed adjacent to the ground electrode of the second IDT electrode.

12. The elastic wave filter of claim 11 wherein the third IDT electrode has an even number of electrode fingers.

13. The elastic wave filter of claim 10 wherein the wiring electrode of the third IDT electrode is disposed adjacent to the wiring electrode of the second IDT electrode, and the ground electrode of the first IDT electrode is disposed adjacent to the ground electrode of the second IDT electrode.

14. The elastic wave filter of claim 13 wherein the third IDT electrode has an odd number of electrode fingers.

15. The elastic wave filter of claim 10 wherein the pitch spacing between the electrode fingers in each of the first IDT electrode, the second IDT electrode, and the third IDT electrode on the first side of the center line in the third IDT electrode and the pitch spacing between the electrode fingers in each of the third IDT electrode, the fourth IDT electrode, and the fifth IDT on the second side of the center line are asymmetric.

16. The elastic wave filter of claim 10 wherein at least one of a first spacing between the first IDT electrode and the second IDT electrode and a second spacing between the second IDT electrode and the third IDT electrode is different from at least one of a third spacing between the third IDT electrode and the fourth IDT electrode and a fourth spacing between the fourth IDT electrode and the fifth IDT electrode.

17. An elastic wave filter comprising:
an unbalanced signal terminal, a first balanced signal terminal, and a second balanced signal terminal;
a pair of grating reflectors;
first, second, third, fourth, and fifth interdigital transducer (IDT) electrodes arranged in ordinal order between the pair of grating reflectors and each having a wiring electrode and a ground electrode electrically connected to ground, the wiring electrodes of the third and fifth IDT electrodes being disposed adjacent to the ground electrode of the fourth IDT electrode, the wiring electrode of the second IDT electrode being disposed adjacent to the wiring electrode of the third IDT electrode, and the ground electrode of the first IDT electrode being disposed adjacent to the ground electrode of the second IDT electrode, the unbalanced signal terminal being connected to the wiring electrode of each of the first, third, and fifth IDT electrodes, the first balanced signal terminal being electrically connected to the wiring electrode of the second IDT electrode, and the second balanced signal terminal being electrically connected to the wiring electrode of the fourth IDT electrode, a pitch spacing between electrode fingers in each of the first IDT electrode, the second IDT electrode, and the third IDT electrode on a first side of a center line in the third IDT electrode and a pitch spacing between electrode fingers in each of the fourth IDT electrode and the fifth IDT electrode and the electrode fingers in the third IDT electrode on a second side of the center line being asymmetric, at least one of a first spacing between the first IDT electrode and the second IDT electrode and a second spacing between the second IDT electrode and the third IDT electrode being different from at least one of a third spacing between the third IDT electrode and the fourth IDT electrode and a fourth spacing between the fourth IDT electrode and the fifth IDT electrode.

18. The elastic wave filter of claim 17 wherein a first pitch gradation of the pitch spacing between the electrode fingers in each of the first IDT electrode, the second IDT electrode, and the third IDT electrode on the first side of the center line in the third IDT electrode being gradually reduced by a first spacing $\alpha$ as a distance from the center line increases, and a second pitch gradation of the pitch spacing between the electrode fingers in each of the third IDT electrode, the fourth IDT electrode and the fifth IDT electrode on the second side of the center line being gradually reduced by a second spacing $\beta$ as the distance from the center line increases, where $\alpha$ and $\beta$ are different.

19. The elastic wave filter of claim 18 wherein the third IDT electrode has an odd number of electrode fingers.

* * * * *